United States Patent [19]
Kuwano

[11] Patent Number: 5,914,975
[45] Date of Patent: Jun. 22, 1999

[54] YB-DOPED CRYSTAL FOR A SOLID STATE LASER AND METHOD OF PREPARING THE SAME

[75] Inventor: Yasuhiko Kuwano, Tokyo, Japan

[73] Assignee: NEC Corporation, Tokyo, Japan

[21] Appl. No.: 08/842,771

[22] Filed: Apr. 17, 1997

[30] Foreign Application Priority Data

Apr. 17, 1996 [JP] Japan ..................................... 8-095413

[51] Int. Cl.$^6$ ...................................................... H01J 3/16
[52] U.S. Cl. .............................................................. 372/41
[58] Field of Search ................................. 372/39, 41, 43

[56] References Cited

FOREIGN PATENT DOCUMENTS

| 49-99992 | 9/1974 | Japan . |
|---|---|---|
| 2-154233 | 6/1990 | Japan . |
| 4-35419 | 6/1992 | Japan . |

OTHER PUBLICATIONS

A. R. Reinberg, et al., "GaAs: Si LED Pumped Yb–Doped YAG Laser", Jul. 1971, pp. 11–13, Applied Physics Letters, vol. 19, No. 1.

P. Lacovara, et al., "Room–temperature diode–pumped Yb:YAG laser", Jul. 1991, pp. 1089–1091, Optics Letters, vol. 16, No. 14.

E. Mix, et al., "Efficient cw–Laser Operation of Yb–doped Fluoride Phosphate Glass at Room Temperature", pp. 230–232, Technical Digest 1995 No Month.

D. S. Sumida, et al., Spectroscopy and diode–pumped lasing of $Yb^{3+}$–doped $Lu_3 Al_5 O_{12}$ (Yb:LuAG), pp. 224–226, Technical Digest 1995.

L. D. DeLoach, et al., "Laser and Spectroscopic Properties of Yb–Doped apatite Crystals", 1993, pp. 188–191, Optical Society of America, vol. 15.

*Primary Examiner*—Rodney Bovernick
*Assistant Examiner*—Robert E. Wise
*Attorney, Agent, or Firm*—Young & Thompson

[57] ABSTRACT

The present invention provides a Yb-doped crystal for a solid state laser, wherein a main active element of the Yb-doped crystal comprises $Yb^{3+}$. The Yb-doped crystal for a solid state laser is prepared by increasing a ratio of $Yb^{3+}$ to $Yb^{2+}$ in a Yb-doped material by a heat treatment to the Yb-doped material in an oxidizing atmosphere, and carrying out a crystal growth of the Yb-doped material.

12 Claims, 2 Drawing Sheets

YB-DOPED CRYSTAL FOR A SOLID STATE LASER AND METHOD OF PREPARING THE SAME

BACKGROUND OF THE INVENTION

The present invention relates to a solid-state laser, and more particularly to a Yb-doped crystal for a solid-state laser and a method of preparing the same.

The solid-state laser doped with a Yb activation element had been studied from a long time ago. After a diode excitation had been succeeded, the Yb-doped solid-state laser has become useful. The first observation of laser action was obtained by pumping Yb-doped yttrium aluminum garnet (Yb: YAG) with standard Si-doped GaAs light emission diodes. This is disclosed in the J. Appl. Phys. Lett. 19(1) pp. 11–13, 1971. As a result of recent development of the semiconductor laser diodes, absorption and emission by laser diode excitation have been observed at room temperature. This is disclosed in Optical Letters, 15(16) pp. 1089–1091. Yttrium aluminum garnet YAG (Y3A15O12) is available as a host material to be doped with Yb, which is disclosed in Tech. Digest. ASSL, pp. 230–232, 1995. Garnet system crystals such as glass and LuAg(Lu3A15O12) are available as a host material to be doped with Yb, which is disclosed in Tech. Digest. ASSL, pp. 224–226, 1995. Apatite system fluoride crystals such as FAP(Ca5(PO4)3F) are available as a host material to be doped with Yb, which is disclosed in Tech. Digest. ASSL, pp. 188–191, 1993. The above crystals may be grown by Czochralski method disclosed in Tech. Digest. ASSL, pp. 230–232, 1995.

In the Japanese laid-open patent publications Nos. 5-27980 and 6-107430, it is disclosed to add Yb as a sensitizer into solid state laser crystals.

In the prior art, however, certain techniques for growth of a crystal for a solid state laser with a high emission efficiency had not been established because it had not been found what factor actually provide a great deal of influence to emission efficiency and fluorescence lifetime of the Yb-laser. Even if the desired result could unexpectedly be obtained by accidental combinations of various conditions, such uncertain technique could not be industrially applicable and could not progress the crystal growth technique.

In the above circumstances, it had been establish a certain method of growth of or treatment to a crystal for the Yb-doped solid state laser by explication of any physical factors which provide maximum contribution to improve the emission efficiency of the Yb-doped solid state laser.

SUMMARY OF THE INVENTION

Accordingly, it is an object if the present invention to provide a novel oxide crystal doped with Yb as an active element for a Yb-doped solid state laser free from the above problems.

It is a further object of the present invention to provide a novel oxide crystal doped with Yb as an active element for a Yb-doped solid state laser which possesses a high emission efficiency.

It is a still further object of the present invention to provide a novel oxide crystal doped with Yb as an active element for a Yb-doped solid state laser which possesses a long luminance life-time.

It is yet a further object of the present invention to provide a Yb-doped solid state laser which possesses a high emission efficiency.

It is further more object of the present invention to provide a Yb-doped solid state laser which possesses a long luminance life-time.

It is still more object of the present invention to provide a novel method of stable growth of an oxide crystal doped with Yb as an active element for a Yb-doped solid state laser free from the above problems.

It is yet more object of the present invention to provide a novel method of stable growth of an oxide crystal doped with Yb as an active element for a Yb-doped solid state laser which possesses a high emission efficiency.

It is moreover object of the present invention to provide a novel method of stable growth of an oxide crystal doped with Yb as an active element for a Yb-doped solid state laser which possesses a long luminance life-time.

It is another object of the present invention to provide a novel method of treatment to an oxide crystal doped with Yb as an active element for a Yb-doped solid state laser free from the above problems.

It is still another object of the present invention to provide a novel method of treatment to an oxide crystal doped with Yb as an active element for a Yb-doped solid state laser which possesses a high emission efficiency.

It is yet another object of the present invention to provide a novel method of treatment to an oxide crystal doped with Yb as an active element for a Yb-doped solid state laser which possesses a long luminance life-time.

The above and other objects, features and advantages of the present invention will be apparent from the following descriptions.

The present invention provides a Yb-doped crystal for a solid state laser, wherein a main active element of the Yb-doped crystal comprises $Yb^{3}+$.

It is preferable that a host crystal of the Yb-doped crystal comprises an oxide crystal.

It is also preferable that the oxide crystal comprises YAG.

It is also preferable that the oxide crystal comprises $YVO_4$.

It is also preferable that the oxide crystal comprises LuAG.

The present invention also provides a Yb-doped crystal for a solid state laser, wherein a main sensitizer of the Yb-doped crystal comprises $Yb^{3}+$.

It is preferable that a host crystal of the Yb-doped crystal comprises an oxide crystal.

It is also preferable that the oxide crystal comprises YAG.

It is also preferable that the oxide crystal comprises $YVO_4$.

It is also preferable that the oxide crystal comprises LuAG.

It is also preferable that a main active element of the Yb-doped crystal comprises Er.

The present invention also provides a method of preparing a Yb-doped crystal for a solid state laser comprising the step of increasing a ratio of $Yb^{3}+$ to $Yb^{2}+$ in a Yb-doped material by a heat treatment to the Yb-doped material in an oxidizing atmosphere, and carrying out a crystal growth of the Yb-doped material.

It is preferable that the oxidizing atmosphere includes oxygen in the range of 0.05% to 2%.

It is also preferable that the heat treatment is carried out under a higher pressure than atmospheric pressure.

The present invention also provides a method of preparing a Yb-doped crystal for a solid state laser comprising the step of carrying out a crystal growth of a Yb-doped material to obtain a Yb-doped crystal, and increasing a ratio of $Yb^{3}+$ to $Yb^{2+}$ in the Yb-doped crystal by a heat treatment to the Yb-doped crystal in an oxidizing atmosphere.

It is preferable that the oxidizing atmosphere includes oxygen in the range of 0.05% to 2%.

It is also preferable that the heat treatment is carried out under a higher pressure than atmospheric pressure.

The present invention also provides a method of preparing a Yb-doped crystal for a solid state laser comprising the step of increasing a ratio of $Yb^{3+}$ to $Yb^{2+}$ in a Yb-doped material by a heat treatment to the Yb-doped material in an oxidizing atmosphere during a crystal growth of the Yb-doped material.

It is preferable that the oxidizing atmosphere includes oxygen in the range of 0.05% to 2%.

It is also preferable that the heat treatment is carried out under a higher pressure than atmospheric pressure.

The present invention also provides a method of preparing a Yb-doped crystal for a solid state laser comprising the step of increasing a ratio of $Yb^{3+}$ to $Yb^{2+}$ in a Yb-doped material by a heat treatment to the Yb-doped material under a higher pressure than atmospheric pressure during a crystal growth of the Yb-doped material.

It is also preferable that the heat treatment is carried out in an oxidizing atmosphere.

It is also preferable that the oxidizing atmosphere includes oxygen in the range of 0.05% to 2%.

The present invention also provides a method of measuring a ratio of $Yb^{3+}$ to $Yb^{2+}$ in a Yb-doped material by measuring an optical absorption at peak of the Yb-doped material.

The present invention also provides a method of measuring a ratio of $Yb^{3+}$ to $Yb^{2+}$ in a Yb-doped crystal by measuring an optical absorption at peak of the Yb-doped crystal.

BRIEF DESCRIPTIONS OF THE DRAWINGS

Preferred embodiments of the present invention will be described in detail with reference to the accompanying drawings.

DISCLOSURE OF THE INVENTION

A novel Yb-doped solid state laser crystal of the present invention is obtainable by a specific crystal growth with increasing the numbers of trivalent Yb-ions existing in the crystal and decreasing the number of divalent Yb-ions existing in the crystal.

Alternatively, the novel Yb-doped solid state laser crystal of the present invention is obtainable by the normal crystal growth of Yb-doped crystal and subsequent heat treatment in a specific atmosphere thereof.

The crystal growth method will be described. The crystal growth is carried out at an oxidizing atmosphere. In the prior art, the Nd-doped yttrium aluminum garnet (Nd:YAG) crystal was grown by the Czochralski method, wherein the atmosphere comprises a pure argon or nitrogen, or comprises an argon or nitrogen atmosphere slightly doped with oxygen.

By contrast, in accordance with the present invention, oxygen is added into the atmosphere at a relatively high concentration, for example, in the range of approximately 0.05% to 2%. If the concentration of oxygen in the atmosphere is excessively high, a pot may receive damages and the quality of the crystal grown is deteriorated. As a result, the crystal has the increased number of the trivalent Yb ions and deceased number of divalent Yb ions.

Alternatively, in accordance with the present invention, a material for crystal growth is subjected to a heat treatment in an oxidizing atmosphere for subsequent crystal growth of the heat-treated material. It is possible to subject all of the materials to the heat treatment in the oxidizing atmosphere or subject a part of the materials, which supplies Yb ions. If the Yb-doped yttrium aluminum garnet (Yb:YAG) is intended to be grown, $Yb_2O_3$ is subjected to the heat treatment in the oxidizing atmosphere. As a result, the crystal has the increased number of the trivalent Yb ions and deceased number of divalent Yb ions.

Further alternatively, the crystal growth is carried out in an atmosphere having a pressure of not less than 1 kg/cm². As a result, the crystal has the increased number of the trivalent Yb ions and deceased number of divalent Yb ions.

Figure 1:
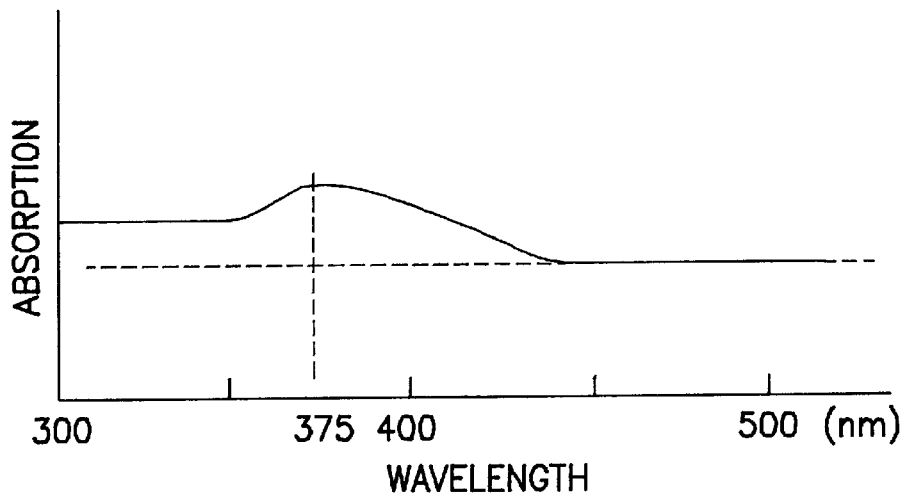
FIG. 1 is a diagram illustrative of variations in absorption versus wavelength of Yb-doped yttrium aluminum garnet (Yb:YAG) crystal for a solid state laser device according to the present invention.

Further in accordance with the present invention, if, however, it is difficult to carry out the crystal growth in an oxygen rich atmosphere, it may be possible to combine the above crystal growth in oxygen poor atmosphere with subsequent heat treatment to be described below. If Yb-doped yttrium aluminum garnet (Yb:YAG) is grown under the same conditions as Nd-doped yttrium aluminum garnet (Nd:YAG), a heat treatment to the crystal is carried out in a pure oxygen atmosphere at a temperature of 1000° C. for 20 minutes. The optimal temperature and the time of the heat treatment to the crystal are different to depend upon the kinds of the crystals. The optimal conditions are found out in consideration of influences of $Yb^{3+}$ to fluorescence intensity and fluorescence life-time. In the prior art, it was difficult to investigate the influences of $Yb^{3+}$ to fluorescence intensity and fluorescence life-time. In accordance with the present invention, however, it is easy to investigate the influences of $Yb^{3+}$ to fluorescence intensity and fluorescence life-time by measuring absorption of the light into the crystal grown. The Yb-doped crystal shows a high efficient optical absorption in a broad band in short-wavelength region. The optical absorption in a broad band in short-wavelength region is caused in association with $Yb^{2+}$. The Yb-doped yttrium aluminum garnet (Yb:YAG) shows a high efficient optical absorption in a relatively broad band at a wavelength center of about 375 nm as illustrated in FIG. 1. The magnitude of the absorption is considered. No absorption or almost no absorption is preferable, for which reason the temperature and the time of the heat treatment as well as atmospheric gas compositions are determined to minimize the optical absorption of the crystal. The various kinds of the host crystals somewhat differ in absorption peak wavelength, whilst the absorption peak wavelength may be in the vicinity of 380 nm.

Figure 2:
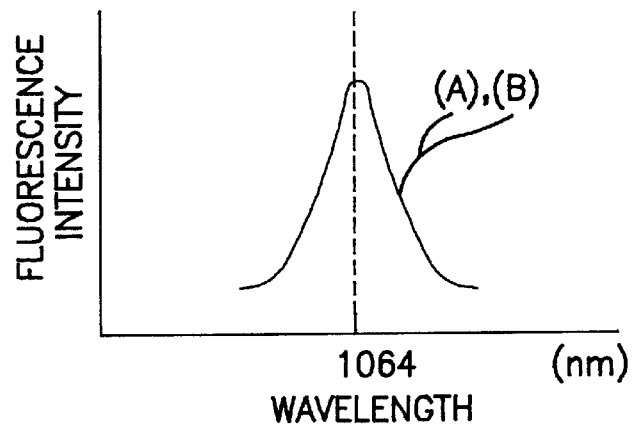
FIG. 2 is a diagram illustrative of variations in fluorescence intensity versus wavelength of Nd-doped yttrium aluminum garnet (Nd:YAG) crystal for a solid state laser device when excited at a 808 nm wavelength light according to the present invention.
Figure 3:
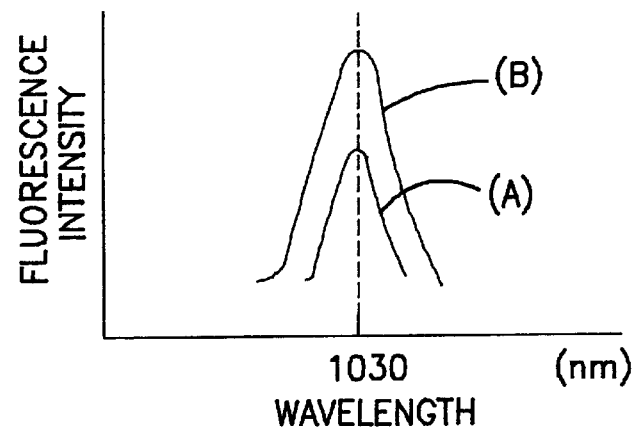
FIG. 3 is a diagram illustrative of variations in fluorescence intensity versus wavelength of Nd-doped yttrium aluminum garnet (Nd:YAG) crystal for a solid state laser device when excited at a 969 nm wavelength light according to the present invention.

FIG. 2 is a diagram illustrative of variations in fluorescence intensity versus wavelength of Nd-doped yttrium aluminum garnet (Nd:YAG) crystal for a solid state laser device when excited at a 808 nm wavelength light according to the present invention. FIG. 3 is a diagram illustrative of variations in fluorescence intensity versus wavelength of Nd-doped yttrium aluminum garnet (Nd:YAG) crystal for a solid state laser device when excited at a 969 nm wavelength light according to the present invention. In FIGS. 2 and 3, the real line (A) represents untreated crystal and (the real line B) represents a crystal subjected to the heat treatment in the oxidizing atmosphere or an oxygen anneal. In Nd-doped yttrium aluminum garnet (Nd:YAG), almost Nd is trivalent Nd or $Nd^{3+}$, for which reason the fluorescence intensity thereof remains unchanged after the oxygen anneal as illustrated in FIG. 2. Since Yb may be divalent and trivalent, $Yb^{2+}$ and $Yb^{3+}$ co-exist in the crystal grown by the normal growth process. The crystal grown by the normal growth process has to be subjected to the oxygen anneal to increase the ratio in the number of trivalent Yb to divalent Yb whereby the fluorescence intensity based upon trivalent Yb is increased as illustrated in FIG. 3.

The present invention was made on the above experimental results found by the inventor. It is important to grow the crystal under the oxidizing condition, for example, in the oxygen rich atmosphere so as to increase the ratio in the number of trivalent $Yb^{3+}$ to divalent $Yb^{2+}$. Otherwise, it is required to subject the normally grown crystal to the heat treatment under the oxidizing conditions so as to increase the ratio in the number of trivalent $Yb^{3+}$ to divalent $Yb^{2+}$. It is effective to make the atmospheric gas into oxidizing gas. It is also effective to prepare the material having a high ratio of the trivalent $Yb^{3+}$. It is also effective to have previously prepared the material having a high ratio of the trivalent $Yb^{3+}$ before the crystal growth is made to obtain the crystal having the high ratio of the trivalent $Yb^{3+}$. It is also effective to have previously prepared the material of coexistence of the divalent $Yb^{2+}$ and trivalent $Yb^{3+}$ for subsequent heat treatment to the material under the oxidizing atmosphere to increase the ratio of trivalent $Yb^{3+}$ to divalent $Yb^{2+}$ before the crystal growth is made to obtain the crystal having the high ratio of the trivalent $Yb^{3+}$. It is also effective to carry out a crystal growth under a high pressure of atmosphere to increase the ratio of trivalent $Yb^{3+}$ by utilizing that the radius of the trivalent $Yb^{3+}$ ions is smaller by about 15 percents than that of the divalent $Yb^{2+}$ ions. It is also effective to have carried out the normal crystal growth for heat treatment under the high pressure of atmosphere to increase the ratio of trivalent $Yb^{3+}$ by utilizing that the radius of the trivalent $Yb^{3+}$ ions is smaller by about 15 percents than that of the divalent $Yb^{2+}$ ions. In accordance with the present invention, it is essential to increase the ratio of trivalent $Yb^{3+}$ to divalent $Yb^{2+}$ in the Yb-doped crystal under the oxidizing conditions or the high pressure atmosphere. By contrast, in the prior art, oxygen is added into the atmosphere in which the crystal growth is made in order to suppress oxygen defects in the host crystal thereby suppressing both stable absorption and transitional absorption, in the light of which the prior art is quite different from the present invention.

By use of the above novel Yb-doped crystal, it is possible to obtain a solid state laser with a high emission efficiency.

PREFERRED EMBODIMENTS

First Embodiment

A first embodiment according to the present invention will be described, in which a novel Yb-doped crystal is provided for a solid state laser having a high emission efficiency. A Yb-doped yttrium aluminum garnet (Yb:YAG) is grown by use of an oxide single crystal pulling system of a high frequency current inductive heating. 179.8 g of $Y_2O_3$ powder with a purity of 99.999%, 148.3 g of $Al_2O_3$ powder with a purity of 99.999%, and 31 g of $Yb_2O_3$ powder with a purity of 99.99%, are determined. Those powders are blended in a V-dry blender for three hours before the blended powders are preburned at a temperature of 1350° C. for 10 hours to be heated up and melt to fill up an iridium pot having a diameter of 50 mm and a depth of 50 mm and being placed in the pulling system. 111-oriented crystal seed is used for a crystal growth at a growth rate of 1 mm/h and a crystal rotation rate of 20 rpm in a nitrogen atmosphere including 500 ppm oxygen. The material composition corresponds to about Yb10at%. A crystal is obtained, which has a diameter of about 25 m and a whole length of about 65 mm. The color of the obtained crystal is extremely light blue. The absorption of 0.034/cm is measured at a wavelength of 375 nm. This absorption is lower by three fifth than that when the crystal growth is carried out in a pure nitrogen atmosphere. The measured fluorescence intensity at a wavelength of 1030 nm is increased by about 15% when excited at a wavelength of 969 nm. The measured fluorescence life time is about 1.6 msec. which is increased by 14%.

Second Embodiment

A second embodiment according to the present invention will be described, in which a novel Yb-doped crystal is provided for a solid state laser having a high emission efficiency. A Yb-doped yttrium aluminum garnet (Yb:YAG) is grown by use of an oxide single crystal pulling system of a high frequency current inductive heating. 179.8 g of $Y_2O_3$ powder with a purity of 99.999%, 148.3 g of $Al_2O_3$ powder with a purity of 99.999%, and 31 g of $Yb_2O_3$ powder with a purity of 99.99%, are determined. Those powders are blended in a V-dry blender for three hours before the blended powders are preburned at a temperature of 1350° C. for 10 hours to be heated up and melt to fill up an iridium pot having a diameter of 50 mm and a depth of 50 mm and being placed in the pulling system. 111-oriented crystal seed is used for a crystal growth at a growth rate of 1 mm/h and a crystal rotation rate of 20 rpm in a nitrogen atmosphere including 2% of oxygen. The material composition corresponds to about Yb10at%. Since iridium is dispersed, it is difficult to maintain the crystal growth for a long time thereby obtaining a small crystal. The color of the obtained crystal is transparent and colorless. The absorption of not more than 0.004/cm is measured at a wavelength of 375 nm. The measured fluorescence intensity at a wavelength of 1030 nm is increased by about 20% when excited at a wavelength of 969 nm. The measured fluorescence life time is about 1.7 msec. which is increased by 20%.

Third Embodiment

A third embodiment according to the present invention will be described, in which a novel Yb-doped crystal is provided for a solid state laser having a high emission efficiency. A Yb-doped yttrium aluminum garnet (Yb:YAG) is grown by use of an oxide single crystal pulling system of a high frequency current inductive heating. 179.8 g of $Y_2O_3$ powder with a purity of 99.999%, 148.3 g of $Al_2O_3$ powder with a purity of 99.999%, and 31 g of $Yb_2O_3$ powder with a purity of 99.99%, are determined. Those powders are blended in a V-dry blender for three hours before the blended powders are preburned at a temperature of 1350° C. for 10 hours to be heated up and melt to fill up an iridium pot having a diameter of 50 mm and a depth of 50 mm and being placed in the pulling system. 111-oriented crystal seed is used for a crystal growth at a growth rate of 1 mm/h and a crystal rotation rate of 20 rpm in a nitrogen atmosphere including 150 ppm of oxygen. The color of the obtained crystal is blue. The absorption of 0.048/cm is measured at a wavelength of 375 nm. The measured fluorescence life time is about 1.4 msec. The obtained crystal is further subjected to an oxygen anneal at a temperature of 1000° C. for 20 hours. The color of the annealed crystal is transparent and colorless. The absorption of not more than 0.004/cm is measured at a wavelength of 375 nm. The measured fluorescence intensity at a wavelength of 1030 nm is increased by about 20% when excited at a wavelength of 969 nm. The measured fluorescence life time is about 2.0 msec, which is increased by about 42%.

Fourth Embodiment

A fourth embodiment according to the present invention will be described, in which a novel Yb:LuAG crystal is provided for a solid state laser having a high emission efficiency. A Yb:LuAG crystal is grown by use of an oxide single crystal pulling system of a high frequency current inductive heating. 155 g of $Lu_2O_3$ powder, 78 g of $Al_2O_3$ powder and 27 g of $Yb_2O_3$ powder are determined. Those powders are blended before the blended powders are heated up and melt to fill up an iridium pot having a diameter of 40 mm and a depth of 40 mm and being placed in the pulling system. 111-oriented crystal seed is used for a crystal growth at a growth rate of 1 mm/h and a crystal rotation rate of 20 rpm in a nitrogen atmosphere including 500 ppm (oxygen. The material composition corresponds to about Yb15at%. A crystal is obtained, which has a diameter of about 23 m and a whole length of about 40 mm. The color of the obtained crystal is light blue. The absorption of 0.03/cm is measured at a wavelength of 375 nm. This absorption is lower by three fourth than that when the crystal growth is carried out in a pure nitrogen atmosphere. The measured fluorescence intensity at a wavelength of 1030 nm is increased by about 10% when excited at a wavelength of 940 nm.

Fifth Embodiment

A fifth embodiment according to the present invention will be described, in which a novel Yb:LuAG crystal is provided for a solid state laser having a high emission efficiency. A Yb:LUAG crystal is grown by use of an oxide single crystal pulling system of a high frequency current inductive heating. 155 g of $Lu_2O_3$ powder, 78 g of $Al_2O_3$ powder and 27 g of $Yb_2O_3$ powder are determined. Those powders are blended before the blended powders are preburned in a pure oxygen atmosphere at a temperature of 950° C. for 10 hours to fill up an iridium pot having a diameter of 40 mm and a depth of 40 mm and being placed in the pulling system. 111-oriented crystal seed is used for a crystal growth at a growth rate of 1 mm/h and a crystal rotation rate of 20 rpm in a nitrogen atmosphere including 500 ppm oxygen. The material composition corresponds to about Yb15at%. A crystal is obtained, which has an absorption of 0.013/cm measured at a wavelength of 375 nm.

Sixth Embodiment

A sixth embodiment according to the present invention will be described, in which a novel Yb:$YVO_4$ crystal is provided for a solid state laser having a high emission efficiency. A Yb:$YVO_4$ crystal is grown by use of an oxide single crystal pulling system of a high frequency current inductive heating. 358.6 g of $YVO_4$ powder with a purity of 99.99% and 34.7 g of $Yb_2O_3$ powder with a purity of 99.99% are determined. Those powders are blended in a V-blender for three hours before the blended powders are heated up and melt to fill up an iridium pot having a diameter of 50 mm and a depth of 50 mm and being placed in the pulling system.a-axis-oriented crystal seed is used for a crystal growth at a growth rate of 1 mm/h and a crystal rotation rate of 20 rpm in a nitrogen atmosphere including 0.2% of oxygen. The material composition corresponds to about Yb10at%. A crystal is obtained, which has a diameter of about 15 m and a whole length of about 65 mm. The color of the obtained crystal is dark brown and blue. The absorption of 0.35/cm is measured at a wavelength of 375 nm. The obtained crystal is further subjected to an oxygen anneal at a temperature of 1000° C. for 20 hours. The absorption of 0.08/cm is measured at a wavelength of 375 nm. If the atmospheric pressure of 1.0 kg/cm$^2$ is risen to 1.5 kg/cm$^2$, the absorption of 0.30/cm is measured at a wavelength of 375 nm.

Seventh Embodiment

Figure 4:
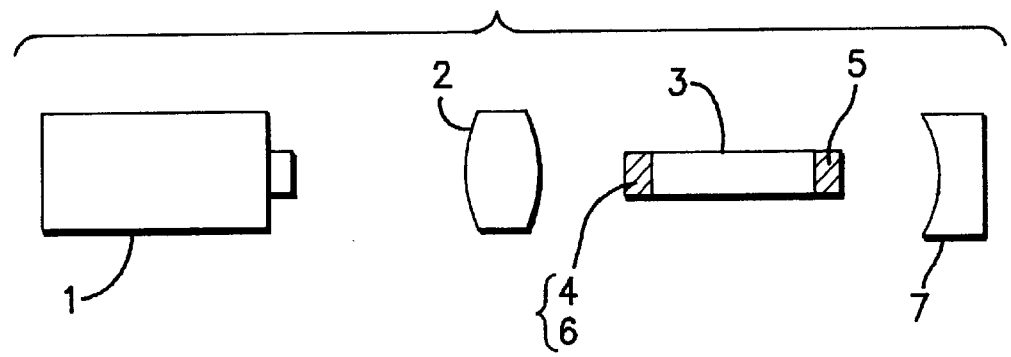
FIG. 4 is a schematic view illustrative of a titanium sapphire laser system using a novel crystal according to the present invention.

A seventh embodiment according to the present invention will be described, in which a novel Er, Yb:$YVO_4$ solid state laser having a high emission efficiency is provided. Er is active element and Yb is sensitizer. A Yb:$YVO_4$ crystal is grown by use of an oxide single crystal pulling system of a high frequency current inductive heating. 358.6 g of $YVO_4$ powder, 8.7 g of $Er_2O_3$ powder and 34.7 g of $Yb_2O_3$ powder are determined. Those powders are blended in a V-blender for three hours before the blended powders are heated up and melt to fill up an iridium pot having a diameter of 50 mm and a depth of 50 mm and being placed in the pulling system.a-axis-oriented crystal seed is used for a crystal growth at a growth rate of 1 mm/h and a crystal rotation rate of 20 rpm in a nitrogen atmosphere including 1% of oxygen. A crystal obtained is processed to form a 1.6 m band laser system as illustrated in FIG. 4. The laser system comprises an excitation light source 1, a condense lens 2, an oscillator 3 and an output coupling mirror 7. The oscillator has one end having a high reflected coat 4 or an anti-reflected coat 6 and an opposite end having an anti-reflected coat 5. About 4% of slope efficiency of a laser emission is obtained at an excitation wavelength of 970 nm which is larger than about 3% of the slop efficiency obtained when the crystal growth is made in the normal atmosphere.

Eighth Embodiment

An eighth embodiment according to the present invention will be described, in which a novel Yb-doped crystal solid state laser having a high emission efficiency is provided. A Yb-doped yttrium aluminum garnet (Yb:YAG) is grown by use of an oxide single crystal pulling system of a high frequency current inductive heating. 179.8 g of $Y_2O_3$ powder with a purity of 99.999%, 148.3 g of $Al_2O_3$ powder with a purity of 99.999%, and 31 g of $Yb_2O_3$ powder with a purity of 99.99%, are determined. Those powders are blended in a V-dry blender for three hours before the blended powders are preburned at a temperature of 1350° C. for 10 hours to be heated up and melt to fill up an iridium pot having a diameter of 50 mm and a depth of 50 mm and being placed in the pulling system. 111-oriented crystal seed is used for a crystal growth at a growth rate of 1 mm/h and a crystal rotation rate of 20 rpm in a nitrogen atmosphere including 150 ppm of oxygen. The color of the obtained crystal is blue. The absorption of 0.048/cm is measured at a wavelength of 375 nm. The measured fluorescence life time is about 1.4 msec. The obtained crystal is further subjected to an oxygen anneal at a temperature of 1000° C. for 20 hours. The color of the annealed crystal is transparent and colorless. The absorption of not more than 0.004/cm is measured at a wavelength of 375 nm. The measured fluorescence intensity at a wavelength of 1030 nm is increased by about 20% when excited at a wavelength of 969 nm. The measured fluorescence life time is about 2.0 msec, which is increased by about 42%. The crystal obtained is further processed to prepare a laser element of 5 mm×5 mm×2 mm and form a laser system as illustrated in FIG. 4. The laser system comprises a 969 nm titanium sapphire wavelength tunable excitation light source 1, a condense lens 2, an oscillator 3 and an output coupling mirror 7. The oscillator has one end having a high reflected coat 4 or an anti-reflected coat 6 and an opposite end having an anti-reflected coat 5. An emission threshold power of the laser is 250 mW. About 30% of slope efficiency of a laser emission is obtained at an excitation wavelength of 969 nm.

Figure 5:
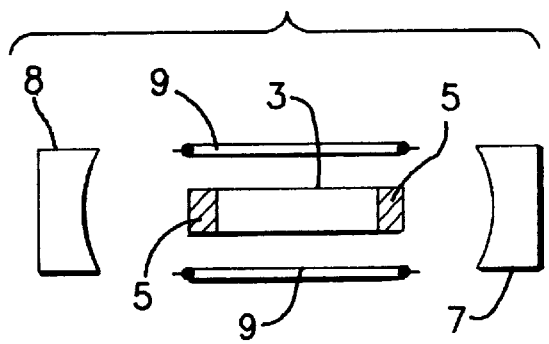
FIG. 5 is a schematic view illustrative of a lamp excitation laser system using a novel crystal according to the present invention.
Figure 6:
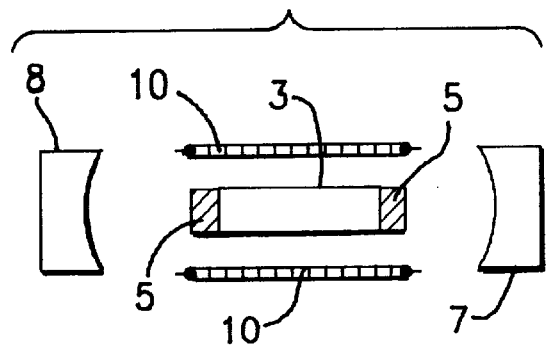
FIG. 6 is a schematic view illustrative of a side-excitation laser diode system using a novel crystal according to the present invention.

As modifications, it is possible to form the laser system as illustrated in FIGS. 5 and 6 in place of the laser system as illustrated in FIG. 4. In FIG. 5, the laser system comprises a mirror 8, an oscillator 3, excitations lamps 9 and an output coupling mirror 7. The oscillator has opposite ends of anti-reflected coats 5. In FIG. 6, the laser system comprises a mirror 8, an oscillator 3, excitation laser diode arrays 10 and an output coupling mirror 7. The oscillator has opposite ends of anti-reflected coats 5.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A method of preparing a Yb-doped crystal for a solid state laser comprising the step of:

increasing a ratio of $Yb^3+$ to $Yb^2+$ in a Yb-doped material by a heat treatment to said Yb-doped material in an oxidizing atmosphere; and carrying out a crystal growth of said Yb-doped material.

2. The method as claimed in claim 1, wherein said oxidizing atmosphere includes oxygen in the range of 0.05% to 2%.

3. The method as claimed in claim 1, wherein said heat treatment is carried out under a higher pressure than atmospheric pressure.

4. A method of preparing a Yb-doped crystal for a solid state laser comprising the step of:

carrying out a crystal growth of a Yb-doped material to obtain a Yb-doped crystal; and increasing a ratio of $Yb^3+$ to $Yb^2+$ in said Yb-doped crystal by a heat treatment to said Yb-doped crystal in an oxidizing atmosphere.

5. The method as claimed in claim 4, wherein said oxidizing atmosphere includes oxygen in the range of 0.05% to 2%.

6. The method as claimed in claim 5, wherein said heat treatment is carried out under a higher pressure than atmospheric pressure.

7. A method of preparing a Yb-doped crystal for a solid state laser comprising the step of:

increasing a ratio of $Yb^3+$ to $Yb^2+$ in a Yb-doped material by a heat treatment to said Yb-doped material in an oxidizing atmosphere during a crystal growth of said Yb-doped material.

8. The method as claimed in claim 7, wherein said oxidizing atmosphere includes oxygen in the range of 0.05% to 2%.

9. The method as claimed in claim 7, wherein said heat treatment is carried out under a higher pressure than atmospheric pressure.

10. A method of preparing a Yb-doped crystal for a solid state laser comprising the step of:

increasing a ratio of $Yb^3+$ to $Yb^2+$ in a Yb-doped material by a heat treatment to said Yb-doped material under a higher pressure than atmospheric pressure during a crystal growth of said Yb-doped material.

11. The method as claimed in claim 10, wherein said heat treatment is carried out in an oxidizing atmosphere.

12. The method as claimed in claim 11, wherein said oxidizing atmosphere includes oxygen in the range of 0.05% to 2%.

* * * * *